United States Patent [19]

Asatourian

[11] Patent Number: 5,600,140
[45] Date of Patent: Feb. 4, 1997

[54] IMBALANCED COMPOSITE FOCAL PLANE ARRAY

[75] Inventor: Rolin K. Asatourian, Fullerton, Calif.

[73] Assignee: Rockwell International Corporation, Seal Beach, Calif.

[21] Appl. No.: 481,000

[22] Filed: Jun. 7, 1995

[51] Int. Cl.⁶ .................................................. G01J 5/06
[52] U.S. Cl. .................................. 250/332; 250/352
[58] Field of Search .............................. 250/332, 208.1, 250/352

[56] References Cited

U.S. PATENT DOCUMENTS

| 4,943,491 | 7/1990 | Norton et al. | 250/332 |
| 5,264,699 | 11/1993 | Barton et al. | 250/332 |
| 5,308,980 | 5/1994 | Barton | 250/332 |

*Primary Examiner*—Carolyn E. Fields
*Attorney, Agent, or Firm*—George A. Montanye; David J. Arthur; Susie H. Oh

[57] ABSTRACT

A focal plane array (FPA) mounted in an imbalanced configuration including several layers of materials with differing thermal expansion coefficients (TECs), moduli of elasticity, and thicknesses to maintain surface planarity and improve the reliability of the FPA during thermal cycling and excursions. An optical substrate is coupled to a multiplexer through an array of indium bumps. The typical TEC mismatch between the optical substrate and the multiplexer is eliminated by forcing the multiplexer to exhibit an effective TEC equal to that of the optical substrate by particularly selecting the types of materials used and the thicknesses of the individual layers of the composite structure. Consequently, undesirable deflections and distortion of the multiplexer and the indium bumps are minimized, thereby substantially improving FPA reliability.

25 Claims, 2 Drawing Sheets 5,600,140

IMBALANCED COMPOSITE FOCAL PLANE ARRAY

BACKGROUND OF THE INVENTION

1. Field of the Invention

The present invention relates to mounting a focal plane array (FPA) on a supporting substrate. More particularly, the mounting structure creates controlled stresses to counteract deflections that adversely affect the reliability of the FPA in the process of thermal cycling.

2. Description of Related Art

A hybrid FPA generally consists of an optical substrate layer, such as sapphire, coated with an optically-sensitive material. An interconnecting scheme typically formed of pliable conducting bumps, is used to establish a mechanical and electrical contact between the optical substrate and an electronic means, such as a silicon multiplexer (MUX), used for electronic signal processing. A difference between the thermal expansion coefficients (TECs) of the detector substrate and the MUX, however, can stress and eventually rupture the bumps in the process of thermal cycling.

To enhance the reliability of a hybrid FPA, a shimming, sandwiched approach has been used (FIGS. 1 and 2), in which a hybrid FPA is mounted on a multi-layer substrate. This approach has been described in related patent application Ser. No. 08/409,230, entitled "HYBRID FOCAL PLANE ARRAY STABILIZING APPARATUS AND METHOD," the disclosure of which is incorporated herein. The MUX 110, 210 is bonded onto a core layer 114, 214 having a high TEC using a bonding epoxy 112, 212. The core layer is then bonded onto a balancing layer 118, 218 of the same material and dimensions as the MUX 110, 210 using the same type of epoxy of the same thickness as the bonding epoxy 112, 212. The MUX, the core layer, the two layers of epoxy, and the balancing layer form a "balanced" structure 124, 224 that forces the MUX to exhibit a TEC which matches the TEC of the optical layer 104, 204, thereby eliminating thermally-generated stresses on the interconnect bumps 108, 208. The balanced nature of such a hybrid FPA and composite structure also prevents the structure from deflecting.

However, since the FPA 100, 200 is generally operated at cryogenic temperatures, reliability concerns may arise when the FPA is turned on and cooled to the operating temperature, and subsequently warmed to ambient temperature when turned off. In FIGS. 1 and 2, the TEC of the composite structure 124, 224 matches that of the optical substrate 104, 204. However, as shown in FIG. 1, both the MUX 110 and the balancing layer 118 may be deflected toward the core layer 114 at the edges due to the edge discontinuity. The convex deflection of the MUX surface in FIG. 2 is caused by contraction of mounting epoxy 220.

Undesirable edge effect deflections could also be produced during contraction of the shimming epoxy 120 while curing, as well as during the cooling process. The convex deflection of the MUX 110 strains the edge bumps 108 leading to bump damage. A convex deflection of the MUX may occur under other circumstances as well. Referring to FIG. 2, if the composite structure 224, including the MUX 210, the core and balancing layers 214, 218 are mounted on a support surface 222, a convex deflection of the MUX and the other layers in the composite structure could also occur due to contraction of the epoxy 220 used in mounting the composite structure onto the supporting surface 222. Because epoxies generally have a higher TEC than silicon, sapphire and the core material, the mounting epoxy may have a tendency to contract with changing temperatures at a higher rate than the other layers in the structure. This contraction of mounting epoxy 220 may occur both during curing and cooling, depending upon the particular type of epoxy used.

SUMMARY OF THE INVENTION

A composite FPA structure according to an embodiment of the invention provides for elimination of undesirable deflections associated with the edge effect. A thicker balancing layer is selected to controllably force the composite structure to deflect in a concave direction by a desired amount during curing or cooling processes. Consequently, damage to the interconnecting bumps around the edges of the FPA is reduced or eliminated. Embodiments of the present invention thus incorporate an imbalanced composite structure (ICS) which provides for deflection opposite to the convex deflection of MUX at the edges, thereby to counteract the edge effect.

Embodiments of the present invention include a composite configuration to enhance FPA reliability. The hybrid FPA includes an optical substrate with a layer of an optically sensitive material grown on one surface of the substrate. The optically sensitive side of the substrate layer is electrically and mechanically coupled via interconnection bumps to a multiplexer substrate (MUX) used for electronic signal processing.

To enhance FPA thermal cycling reliability, the MUX is forced to contract at the same rate as the optical substrate, thereby eliminating the stresses generated due to TEC mismatch between the two layers. A layer of rigid core material is mounted directly beneath the MUX. To counterbalance the bowing that would otherwise result from the TEC mismatch between the MUX and the rigid core material, a balancing layer is bonded to the opposite side of the rigid core layer. The thickness of the balancing layer is different than the MUX thickness to provide an imbalanced composite structure (ICS). The thicknesses of the various layers in the ICS are determined such that the effective TEC of the composite structure matches the TEC of the optical substrate. As a result, in-plane, as well as out-of-plane forces, which would otherwise be present in the cooled bonded structure, are eliminated.

DETAILED DESCRIPTION OF THE PREFERRED EMBODIMENTS

The following description is of the best presently contemplated mode of carrying out the invention. In the accompanying drawings, like numerals designate like parts in the several figures. This description is made for the purpose of illustrating the general principles of the invention and should not be taken in a limiting sense. The scope of the invention is best determined by reference to the accompanying claims.

In the typical operation of a hybrid focal plane array (FPA), the FPA is cooled down to cryogenic temperatures every time it is turned on. During its lifetime, the FPA is exposed to a number of thermal cycles between ambient and cryogenic temperatures. The number of cycles depends on the particular application. In some applications, it is desirable that the FPA be able to survive thousands of thermal cycles with only minimal degradation. Thus, the FPA must maintain its mechanical integrity and electrical functionality as it is cooled down repeatedly. However, it is recognized that the larger the hybrid FPA, the greater will be the stresses caused by the mismatch of the thermal expansion coefficients (TECs) of the various layers, especially at the edges and corners of the FPA structure. Thus, the practical size of hybrid FPAs is limited in part by reliability problems relating to the mismatch of the thermo-mechanical properties material characteristics of the various layers.

According to preferred embodiments of the present invention, the symmetry of the layered materials in the hybrid FPA is perturbed in a controlled manner to counteract deleterious side-effects observed in otherwise balanced composite structures. In accordance with FPA mounting embodiments of the present invention, it has been found that sufficient stress can be created in a direction opposite that of a particular undesirable phenomenon to overcome its deleterious effects.

Figure 3:
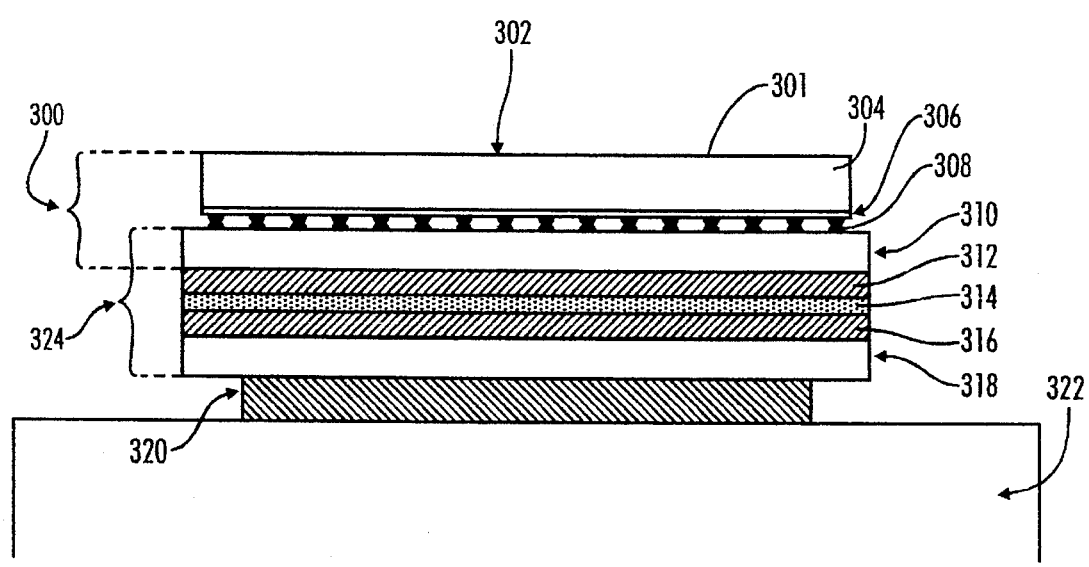
FIG. 3 is a cross-sectional view of a hybrid FPA having an imbalanced composite mounting structure in accordance with preferred embodiments of the present invention.

A cross-section of a hybrid focal plane array (FPA) 300 in accordance with a preferred embodiment of the present invention is indicated in FIG. 3. In the illustrated FPA, infrared radiation 302 impinges on the top surface 301 of an optical substrate 304. The optical substrate 304 is preferably formed of sapphire, with an optically sensitive material 306 grown on one of the surfaces. As shown in the FPA configuration of FIG. 3, the optically sensitive material is disposed on the lower surface of the optical substrate 304. The impinging radiation 302 is transmitted through the optical substrate 304 and arrives at the optically sensitive material 306, where it is converted to electrical charge. Preferably, the optically sensitive material 306 comprises a mercury-cadmium-telluride (HgCdTe) compound on a buffering cadmium-telluride (CdTe).

Particular areas of the optically sensitive material 306 are electrically isolated into individual pixels (not shown). The electrical charge collected at each pixel location is passed through one of plural interconnect bumps 308 to corresponding cells disposed on substrate 310. The size of the FPA may vary depending upon the number of pixels in the array, e.g., 128×128 and 1024×1024.

In preferred embodiments, the substrate 310 comprises a multiplexer (MUX) containing electronic circuitry which processes the electric charge at each pixel into an electrical signal of desired characteristics, and subsequently outputs the signals via output channels. A clocking scheme provides for the orderly transfer of signals out of the MUX. The MUX is preferably formed of a silicon (Si) substrate or other semiconducting material, such as gallium arsenide (GaAs), appropriate for fabricating integrated circuits. It will be recognized, however, that the materials and configuration of the MUX substrate, the number of output channels, the signal characteristics, the clocking scheme and its speed will vary depending upon the particular application. Alternatively, the substrate 310 may comprise a basic interconnection scheme which allows for conducting electric charge out of each pixel without electronic signal processing.

For improved performance, the FPA 300 generally must be cooled to cryogenic temperatures. The support surface 322 is preferably cooled by a direct contact cold source, such as a cryostat or liquid cryogen. In preferred embodiments, the support surface 322 is formed of a ceramic material, and the mounting epoxy 320 is Sylgard. The height and area of the epoxy 320 are preferably chosen to satisfy the thermal conductivity requirements of a particular application. For example, a thinner support surface and epoxy structure having a large surface area and high thermal conductivity provides a rapid cooling rate for the FPA.

The MUX substrate 310 and the optical substrate 304 differ in their Thermal Expansion Coefficients (TECs). For example, preferably, the MUX substrate 310 is formed of silicon, and the optical substrate 304 is sapphire. Due to the differences in the properties of the materials used, including the mismatch of their TECs, thermal stresses are created in the cooling process. As a consequence, in-plane forces, which strain the bumps laterally, as well as out-of-plane forces, which strain and compress the interconnect bumps vertically, may be generated during the cooling process. Moreover, since the bumps are attached on one side to the surface of the optically sensitive material, the in-plane and out-of-plane forces are also transmitted to the optically sensitive material, thus degrading the quality of the material and causing a potentially significant decline in the performance of the FPA. Repeated cool-down of the FPA may aggravate the damage.

To improve FPA reliability, the MUX 310 is preferably mounted on a core layer 314 using an appropriate epoxy 312. The core layer is preferably formed of a rigid material, such as stainless steel, which has a higher modulus of elasticity and TEC than the MUX. The core layer 314 is coupled to a balancing layer 318 using another layer of epoxy 316 which preferably is of the same type and has the same thickness as epoxy layer 312. Accordingly, if the epoxy layers 312 and 316 have the same characteristics, and the balancing layer 318 is formed of the same material and thickness as the MUX 310, a symmetry exists where the core layer 314 represents the plane of symmetry within the composite structure. It will be recognized that an approximate symmetry may be adequate in instances where the types and thicknesses of epoxy layers 312 and 316 are similar, though not exactly the same. Likewise, if the materials of the MUX and balancing layers are substantially similar, an approximate symmetry may also be presented.

In preferred embodiments, the composite structure 324 is constructed of imbalanced layers of materials to induce a predetermined amount of stress which can counteract deleterious edge effects. Whether balanced or imbalanced, the composite structure 324 exhibits a TEC that is the same as that of the detector substrate 304, thereby eliminating stresses caused by a substantial TEC mismatch between the optical substrate 304 and MUX 310. Such a structure, if not perturbed by external forces such as contraction of the mounting epoxy 320, would consequently resist bowing or deflecting.

Figure 1:
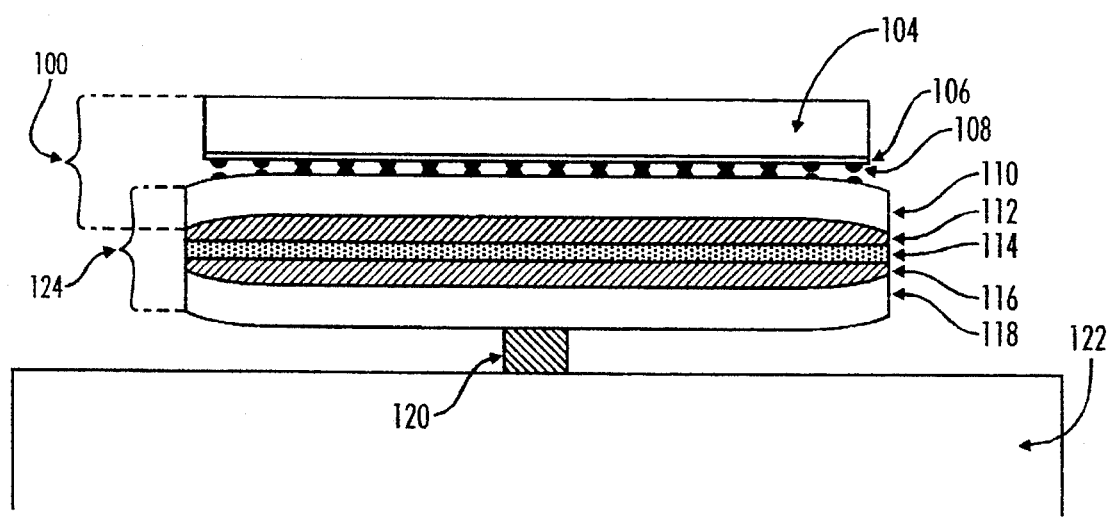
FIG. 1 is a cross-sectional view of a composite hybrid FPA structure affected by bump damage due to edge effects.
Figure 2:
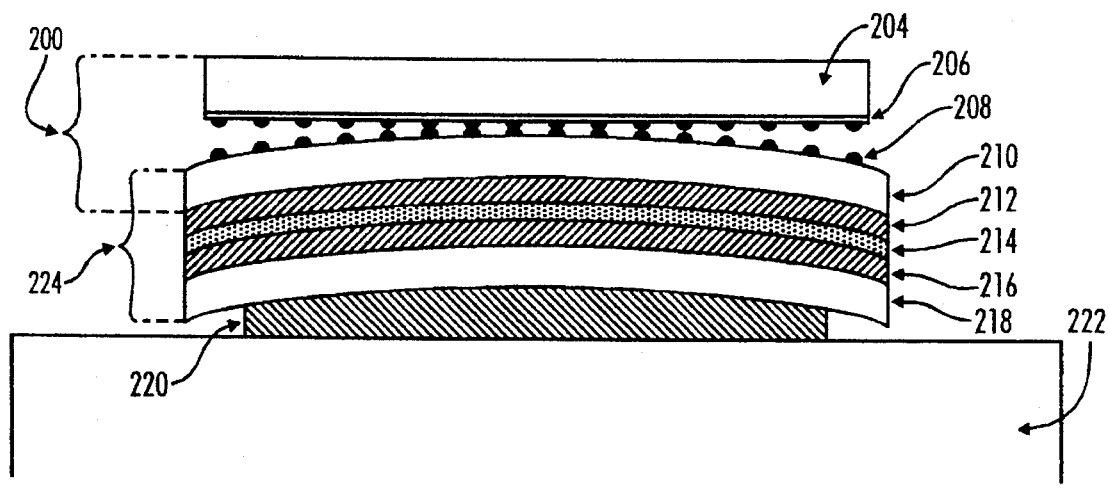
FIG. 2 is a cross-sectional view of a composite hybrid FPA structure affected by bump damage attributable to contraction of the mounting epoxy.

FIG. 3 illustrates the FPA and composite structure mounted on a support substrate 322 for physical support and cooling. For a desired high rate of cooling, the mounting epoxy 320 may be chosen to be large. A large contact area and/or a small thickness of epoxy between the composite structure 324 and the support substrate 322 provides faster heat transfer between the two sets of materials. However, as explained above, choosing such an area and thickness for the epoxy tends to contribute to the distortion of the MUX substrate 310, consequently, causing damage to the interconnect bumps 308 coupling the optically sensitive material 306 to the MUX, as indicated in FIG. 2. Another effect that may perturb MUX surface planarity is shown in FIG. 1. The MUX 110 and the balancing layer 118 are deflected inward as the result of contraction of epoxy 112 and 116 in the curing and/or cooling process, combined with the discontinuity at the edge.

To counteract the detrimental effects of the contracting epoxy, as well as other causes of bowing and deflection of the MUX 110, embodiments of the present invention propose implementing a MUX substrate and a balancing layer 318 within the composite structure 324 which have differing thicknesses and characteristics. Accordingly, an imbalanced composite structure is presented. As illustrated in FIG. 3, the balancing layer 318 is slightly thicker than the MUX substrate 310 to counteract the tendency of the MUX edges to distort. By preserving the surface planarity of the MUX 310, the integrity of the interconnect bumps 308 can be maintained. Thus, counterbalancing the out-of-plane forces acting on the MUX results in improved reliability for the hybrid FPA.

Furthermore, in instances where the composite structure 324 is distorted into a concave configuration, such as when the FPA is exposed to a bump reflow process, an imbalanced structure would also provide a stabilizing platform. In similar circumstances, it may be desirable to construct the composite structure so that the balancing layer 318 is thinner than the MUX 310.

Alternatively, the imbalancing of the composite structure may be achieved by using particular materials having differing thicknesses and/or material properties. For example, a balancing layer having a higher TEC and/or a modulus of elasticity similar to that of the MUX may be used. The result would be similar to using a thicker balancing layer when the materials of the balancing layer and the MUX are the same or substantially similar. In another alternative, both the thicknesses and the material characteristics of the balancing layer as well as the MUX may be tailored to produce the desired counteracting effect. Furthermore, by varying the thickness and type of epoxy 316 from that of epoxy 312, a desired imbalance may be created.

It will be recognized that a variety of adhesives and epoxies may be used to bond the various layers of the FPA, including the composite structure, together. For example, adhesives or other coupling means may be implemented to satisfy the TEC, modulus of elasticity, thermal conductance, out-gassing, curing, and other mechanical, thermal, chemical, manufacturing, and economic requirements desired in a particular design.

This detailed description is set forth only for purposes of illustrating examples of the present invention and should not be considered to limit the scope thereof in any way. Clearly numerous additions, substitutions, and other modifications can be made to the invention without departing from the scope of the invention which is defined in the appended claims and equivalents thereof.

I claim:

1. A hybrid Focal Plane Array (FPA) structure for detecting incoming radiation, wherein the hybrid FPA is subject to thermal excursions, comprising:

a detector including a radiation-sensitive optical substrate for receiving the incoming radiation and converting the incoming radiation to electrical charge;

a composite structure (CS) coupled to the detector, the CS including electronic means for receiving the electrical charge from the optical substrate, the electronic means being subject to distortion and deflection from the thermal excursions, a core layer coupled to the electronic means, and a balancing substrate coupled to the core layer for balancing the distortion and deflection experienced by the electronic means, the core layer being sandwiched between the electronic means and the balancing substrate; and interconnection means for mechanical, electrical, and thermal coupling of the detector to the CS, such that the radiation detected by the detector is transmitted as electrical charge through the interconnection means to the electronic means, wherein the distortion and deflection of the electronic means caused by thermal excursions tend to damage the interconnection means, further wherein the electronic means, the core layer, and the balancing substrate have differing moduli of elasticity, thicknesses, and thermal expansion coefficients (TECs) such that distortion and deflection of the composite structure are minimized, thereby reducing damage to the interconnection means.

2. The hybrid FPA of claim 1, further comprising an optically sensitive material coupled to the optical substrate, wherein the optical substrate includes a first surface and a second surface, the optically sensitive material being located on the second surface of the optical substrate, between the detector and the interconnection means, the radiation entering the first surface of the optical substrate, and further wherein the optically sensitive material absorbs the radiation entering the detector, and converts the radiation into the electrical charge, such that the electrical charge is transmitted through the interconnection means to the electronic means.

3. The hybrid FPA of claim 2, wherein the optically sensitive material comprises a combination of mercury-cadmium-telluride and cadmium-telluride compounds.

4. The hybrid FPA of claim 1, wherein the electronic means contains electronic circuitry for processing the electrical charge generated by the optically sensitive material into electrical signals.

5. The hybrid FPA of claim 4, wherein the electronic circuitry comprises a multiplexer formed within a semiconducting substrate.

6. The hybrid FPA of claim 5, wherein the semiconducting substrate comprises silicon.

7. The hybrid FPA of claim 1, wherein the optical substrate comprises a crystalline material.

8. The hybrid FPA of claim 1, wherein the optical substrate comprises a crystalline material selected from the group consisting essentially of sapphire, cadmium telluride, and cadmium zinc telluride.

9. The hybrid FPA of claim 1, wherein the interconnection means is formed of a pliable conducting material.

10. The hybrid FPA of claim 1, wherein the interconnection means comprises a plurality of indium bumps.

11. The hybrid FPA of claim 1, wherein the core layer is formed of stainless steel.

12. The hybrid FPA of claim 1, wherein the core layer is formed of a material having a high TEC and modulus of elasticity relative to the electronic means and the balancing substrate.

13. The hybrid FPA of claim 1, further comprising cooling means for supporting the CS, and for cooling the CS and detector, wherein the cooling means comprises a ceramic material.

14. The hybrid FPA of claim 13, further comprising an adhesive for securely mounting the CS to the cooling means, and for isolating the CS and detector from the cooling means, wherein the adhesive produces associated distortion of the CS.

15. The hybrid FPA of claim 14, wherein the materials forming the electronic means, the core layer, and the balancing substrate are selected according to their thicknesses and TECs, such that distortion associated with the adhesive is minimized.

16. The hybrid FPA of claim 1, wherein the electronic means is thinner than the balancing substrate to counteract may distortion and deflection caused by the thermal excursions.

17. The hybrid FPA of claim 1, wherein the electronic means is thicker than the balancing substrate to counteract any distortion and deflection caused by the thermal excursions.

18. An imbalanced composite focal plane array (FPA) structure for processing incoming radiation, the FPA comprising:

a detector substrate for receiving and transmitting the incoming radiation, the detector substrate having first and second surfaces, the first surface for receiving the incoming radiation;

an optically sensitive material coupled to the second surface of the detector substrate for absorbing the radiation received by the detector substrate, and for converting the radiation into electrical charge;

a semiconductor substrate coupled to the optically sensitive material, the semiconductor substrate for receiving the electrical charge generated by the optically sensitive material, the semiconductor substrate having a first surface and a second surface, the semiconductor substrate having an associated distortion and flexure attributable to thermal and physical changes;

interconnection means sandwiched between the optically sensitive material and the first surface of the semiconductor substrate, the interconnection means for mechanically and electrically coupling the optically sensitive material to the semiconductor substrate such that the interconnection means transmits the electrical charge through to the semiconductor substrate, wherein the interconnection means are susceptible to damage due to the distortion and flexure of the semiconductor substrate;

a balancing substrate coupled to the semiconductor substrate to support the semiconductor substrate from distortion and flexure;

a core layer sandwiched between the semiconductor and balancing substrates, wherein the core layer, the balancing substrate, and the semiconductor substrate are constructed of materials having associated moduli of elasticity, thermal expansion coefficients (TECs), and thicknesses, further wherein the materials forming the core layer and the balancing and semiconductor substrates are selected such that their moduli of elasticity, TECs, and thicknesses counterbalance each other to maintain the semiconductor substrate in a substantially flat configuration to minimize damage to the interconnection means and the optically sensitive material; and a platform coupled to the balancing substrate for supporting and cooling the balancing substrate, the core layer, the semiconductor substrate, and the detector substrate.

19. The FPA of claim 18, wherein the thickness of the semiconductor substrate material is different from the thickness of the balancing substrate material, such that when the balancing substrate, the core layer, the semiconductor substrate, and the detector substrate are cooled, the semiconductor substrate is substantially planar and the interconnection means are not damaged due to distortion and flexure.

20. The FPA of claim 19, wherein the balancing substrate is thicker than the semiconductor substrate.

21. The FPA of claim 19, wherein the semiconductor substrate is thicker than the balancing substrate.

22. The FPA of claim 18, wherein the optically sensitive material comprises a combination of mercury-cadmium-telluride and cadmium-telluride compounds.

23. The FPA of claim 18, wherein the interconnection means is formed of a pliable conducting material.

24. The FPA of claim 18, wherein the interconnection means comprises a plurality of indium bumps.

25. A method of stabilizing a focal plane array (FPA) provided with a detector substrate for receiving impinging radiation, and an electronic network coupled to the detector substrate or processing the radiation, the method comprising the steps of:

connecting the electronic network to the detector substrate via an interconnection network of pliable, electrically-conducting material;

attaching the electronic network to a core layer;

coupling the electronic network and core layer arrangement to a balancing layer, wherein the electronic network, core layer and balancing substrate have associated thicknesses and thermal expansion coefficients (TECs), further wherein the thickness of the electronic network is selected to be different from the thickness of the balancing substrate such that when the detector substrate, the electronic network, the core layer, and the balancing substrate are exposed to thermal excursions in response to the received radiation, distortion and deflection of the electronic network and interconnection network typically associated with the thermal excursions are minimized;

mounting the balancing layer onto a support substrate via an isolation adhesive; and curing the isolation adhesive such that the balancing layer is securely separated from the support substrate.

* * * * *